United States Patent
Meehleder

(10) Patent No.: US 10,393,780 B2
(45) Date of Patent: Aug. 27, 2019

(54) ULTRASONIC BASED LOAD CENTER CURRENT MEASUREMENT SYSTEM

(71) Applicant: SCHNEIDER ELECTRIC USA, INC., Schaumburg, IL (US)

(72) Inventor: Steven M. Meehleder, Cedar Rapids, IA (US)

(73) Assignee: SCHNEIDER ELECTRIC USA, INC., Andover, MA (US)

( * ) Notice: Subject to any disclaimer, the term of this patent is extended or adjusted under 35 U.S.C. 154(b) by 16 days.

(21) Appl. No.: 15/105,951

(22) PCT Filed: Dec. 20, 2013

(86) PCT No.: PCT/US2013/076841
§ 371 (c)(1),
(2) Date: Jun. 17, 2016

(87) PCT Pub. No.: WO2015/094324
PCT Pub. Date: Jun. 25, 2015

(65) Prior Publication Data
US 2016/0320436 A1    Nov. 3, 2016

(51) Int. Cl.
*G01R 21/133* (2006.01)
*G08C 23/02* (2006.01)
(Continued)

(52) U.S. Cl.
CPC ........... *G01R 21/133* (2013.01); *G08C 23/02* (2013.01); *H04Q 9/00* (2013.01); *G01R 19/0092* (2013.01); *G01R 19/2513* (2013.01); *G01R 27/08* (2013.01)

(58) Field of Classification Search
CPC ............... G01R 19/00; G01R 19/0084; G01R 19/0092; G01R 19/2513; G01R 19/30; G01R 15/00; G01R 15/12; G01R 15/144; G01R 21/00; G01R 21/133; G01R 25/00; G01R 27/00; G01R 27/02; G01R 27/08; G01R 27/26; G01R 27/2611; G01R 27/2623; G01R 27/267; G01R 31/00; G01R 31/08; G01R 31/261; G01R 31/2623;
(Continued)

(56) References Cited

U.S. PATENT DOCUMENTS 3,980,954 A    9/1976   Whyte
4,272,687 A    6/1981   Borkan
(Continued)

FOREIGN PATENT DOCUMENTS

WO    2010005429 A1    1/2010

OTHER PUBLICATIONS

International Search Report and Written Opinion dated Apr. 29, 2014 in PCT/US13/76841, 22pp.

*Primary Examiner* — Hoai-An D. Nguyen
(74) *Attorney, Agent, or Firm* — Locke Lord LLP

(57) ABSTRACT

A method and an apparatus are provided for monitoring the currents in a load center, and ultrasonically reporting currents to a data aggregator. The monitoring is performed by branch circuit current monitors which are inductive. The data aggregator receives the current reports from the branch circuit current monitors. The data aggregator manages collisions and transmission medium distortions to ensure reliable receipt of the current reports and stores in a storage location that which it learns about the currents drawn.

20 Claims, 8 Drawing Sheets

(51) Int. Cl.
*H04Q 9/00* (2006.01)
*G01R 27/08* (2006.01)
*G01R 19/00* (2006.01)
*G01R 19/25* (2006.01)

(58) Field of Classification Search
CPC ...... G01R 31/28; G01N 27/025; G08C 23/02; H04Q 9/00
USPC ....... 324/500, 512, 522, 600, 649, 654, 713, 324/76.11; 702/1, 57, 64
See application file for complete search history.

(56) References Cited

U.S. PATENT DOCUMENTS

| | | |
|---|---|---|
| 4,367,458 A | 1/1983 | Hackett |
| 5,898,304 A * | 4/1999 | Mandl ............... G01B 7/00 |
| | | 324/202 |
| 5,982,297 A | 11/1999 | Welle |
| 5,998,992 A * | 12/1999 | Arai .................. G01B 7/003 |
| | | 324/207.13 |
| 6,120,460 A * | 9/2000 | Abreu ................ A61B 3/1241 |
| | | 600/405 |
| 6,469,498 B1 * | 10/2002 | Steinich ............. G01B 7/003 |
| | | 324/207.13 |
| 6,982,646 B2 | 1/2006 | Rodgers et al. |
| 7,453,267 B2 | 11/2008 | Westbrock, Jr. et al. |
| 8,004,418 B2 | 8/2011 | Hetzmannseder et al. |
| 8,111,148 B2 | 2/2012 | Parker et al. |
| 8,624,578 B2 * | 1/2014 | Rupert ................ G01R 21/133 |
| | | 324/110 |
| 2005/0033201 A1 * | 2/2005 | Takahashi ...... A61B 17/320068 |
| | | 601/2 |
| 2008/0183076 A1 * | 7/2008 | Witte .................. A61B 5/0093 |
| | | 600/438 |
| 2011/0102958 A1 * | 5/2011 | Meehleder .............. H02H 1/06 |
| | | 361/93.1 |
| 2012/0051187 A1 | 3/2012 | Paulson |
| 2012/0221278 A1 * | 8/2012 | Cook .................. G01R 21/133 |
| | | 702/107 |
| 2013/0268216 A1 * | 10/2013 | Dalban Pilon ......... G01R 31/08 |
| | | 702/58 |
| 2013/0329331 A1 | 12/2013 | Erger et al. |
| 2014/0022083 A1 | 1/2014 | Wells et al. |
| 2014/0062456 A1 * | 3/2014 | Alles .................... G01R 25/00 |
| | | 324/86 |
| 2016/0231383 A1 * | 8/2016 | Meehleder ............. G01D 5/268 |
| 2016/0349213 A1 * | 12/2016 | Kollgaard .......... G01N 29/0645 |
| 2016/0349311 A1 * | 12/2016 | Hayashi .............. G01R 31/2829 |

* cited by examiner

ULTRASONIC BASED LOAD CENTER CURRENT MEASUREMENT SYSTEM

FIELD OF THE INVENTION

The invention is generally directed to load center current measurement.

BACKGROUND OF THE INVENTION

In order to create a Smart Grid infrastructure to better manage energy resources, it will be necessary to measure and report energy demand at the individual points of consumption in homes, at places of business, and at industrial sites. The focal point for electrical power distribution in homes, businesses, and factories is the load center, where the branch circuits are organized with branch circuit breakers occupying branch location slots in the load center, and connected through the circuit breakers to an incoming main power bus. The load center is one location for installing the capability to measure and report energy demand.

The universal installation of energy measurement and reporting equipment in homes, businesses, and factories must be simple, practical, and inexpensive.

SUMMARY OF THE INVENTION

The present disclosure provides a practical, reliable, and inexpensive solution for monitoring the currents drawn by one or more of the branch circuits hosted by a load center, and reporting those currents from the load center to a device such as a data aggregator. The solution offers easy installation. If deinstallation is desired, this too is easy. The use of ultrasonic transmission allows for wireless communication of the currents without the use of radio frequency. As such, protection electronics of the load center are spared the operational difficulties which can arise due to radio frequency influences.

The monitoring is performed by devices such as branch circuit current monitors. An example of the branch circuit current monitor is described in co-pending International Patent Application Serial No. PCT/US13/64025, filed on Oct. 9, 2013, entitled SELF-CONTAINED BRANCH CIRCUIT MONITOR (Ref. No. CRC-0290-WO (1005700.021WO)). Each branch circuit current monitor individually senses the current of a particular load center branch from a wire of that branch. The branch circuit current monitors are inductively powered. Being inductively powered rather than line powered allows the effort and cost of providing line power to be avoided. Sensing current inductively rather than via a wireline connection eases installation and reduces costs. Inductive sensing and inductive power both support easy removal should such be desired. Moreover, the branch circuit current monitors transmit higher current measurements more often and with greater reliability. As higher currents tend to be the ones of greatest interest in a monitoring scenario, this branch circuit current monitor behavior is advantageous.

The data aggregator attached to the load center receives the currents ultrasonically reported by the branch circuit current monitors. All current reports are received by the data aggregator in a timely fashion. The data aggregator manages collisions and transmission medium distortions to ensure reliable receipt of the current reports. The data aggregator may store that which it learns about the currents drawn by the branch circuits in a location—for instance a micro secure digital (SD) card—which facilitates easy and confidential retrieval of that information for access by a PC, smartphone, or other device while avoiding network related issues. The currents are reported from the branch circuit monitors not via encoded digital data but instead via pulses whose quantities are counted at the data aggregator. Current report via these pulses is implemented such that a pulse represents a small amount of current. A missed pulse therefore does not result in a large current determination error. Further, by forgoing the use of encoded digital data the need for corresponding error detection and correction is eliminated.

A branch circuit current report is sent as an ultrasonic burst message composed of three sections separated by periods of silence. The first burst section is a reception tuning preamble of a fixed number of pulses. The reception tuning preamble allows the data aggregator to determine the response characteristic (e.g., reverberation time) of the load center interior when employed as a transmission medium for the ultrasonic burst. The data aggregator employs this response characteristic to accurately acquire the remaining sections of the burst.

The second burst section indicates the branch identity (e.g., branch number) of the particular branch circuit to which the burst corresponds. The quantity of pulses in this second section is proportional to the identity. The third burst indicates the current drawn by the branch circuit. The quantity of pulses in this third section is proportional to that current. The duration of each of the periods of silence takes into account the response characteristics of the load center interior. How often the burst is sent by the branch circuit monitor is proportional to the measured current drawn by the branch circuit. This results in higher current measurements being transmitted more often.

The branch circuit current monitor includes a sensor coil (i.e., a current transformer (CT)), circuitry, and an ultrasonic transmitter. The branch circuit current monitor is programmed, via a tool, to correspond to a particular branch to be monitored. Threaded through the branch circuit current monitor is a wire of that branch. The branch circuit current monitor may be self-powered from its current sensor coil. The data aggregator includes an ultrasonic detector, circuitry, and at least one memory (e.g., a nonvolatile memory such as a micro SD card) which can be removable. Options for attaching the data aggregator to the load center include plugging the data aggregator into an empty load center circuit breaker slot, and affixing the data aggregator to the load center door. Both options provide for compact installation, and avoid the need for wires to exit the load center.

In this manner, the invention provides a practical, reliable, and inexpensive solution for monitoring branch circuit current draw in a load center, and reporting those currents to a data aggregator for easy retrieval.

DETAILED DESCRIPTION OF THE EXAMPLE EMBODIMENTS

The present disclosure provides a practical, reliable, and inexpensive solution for monitoring the currents drawn by one or more of the branch circuits hosted by a load center, and reporting, via devices such as branch circuit current monitors, those currents from the load center to a device such as a data aggregator. The reporting may be via ultrasonic transmission. The use of ultrasonic transmission allows for wireless communication of the currents without the use of radio frequency. As such, protection electronics of the load center are spared the operational difficulties which can arise due to radio frequency influences. To facilitate description, the following discussion will refer to ultrasonic transmission, branch circuit current monitors, and data aggregators.

Figure 1:
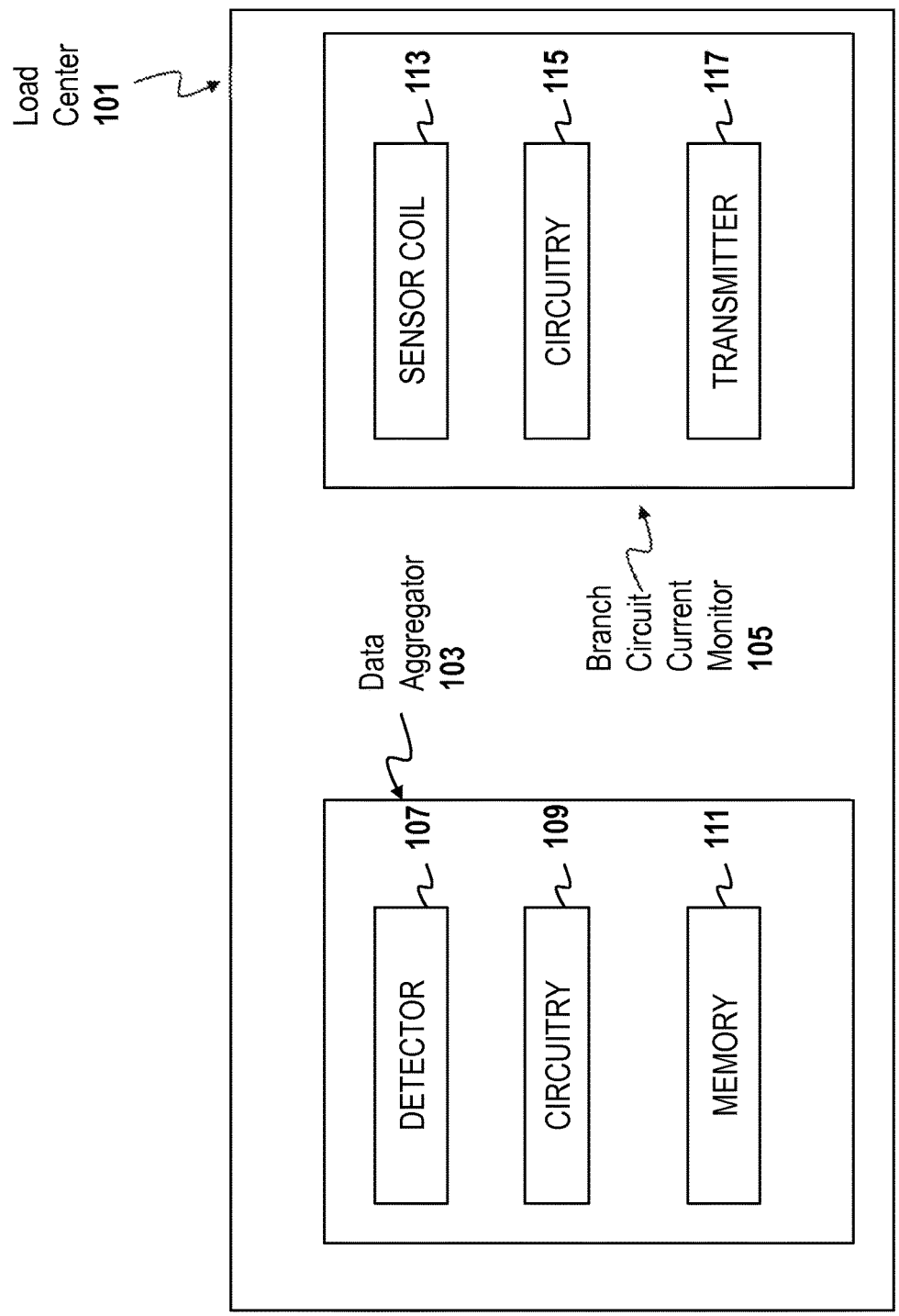
FIG. 1 illustrates an example of a load center with a branch circuit current monitor and a data aggregator, in accordance with an embodiment of the present disclosure.

FIG. 1 illustrates an example embodiment of the invention, showing load center 101 with data aggregator 103 and branch circuit current monitor 105. Data aggregator 103 has ultrasonic detector 107, circuitry 109 (e.g., processor(s) and other signal processing circuitry), and one or more removable memories 111 (e.g., a portable memory such as a SD card). Branch circuit current monitor 105 has current sensor coil 113, circuitry 115 (e.g., processor(s) and other signal processing circuitry), and ultrasonic transmitter 117. Branch circuit current monitor 105 may be inductively-powered by coil 113. Branch circuit monitoring might, for instance, support 24-hours-a-day, seven-days-a-week monitoring, monitoring of currents as low as 0.1 amp (A) Root Mean Square (RMS), and/or provide monitoring accurate up to 150% of the full capability of a branch (e.g., 30 A for a 20 A circuit breaker). Examples of components of a branch circuit current monitor 105 and a data aggregator 103 are discussed further below with reference to FIGS. 7 and 8, respectively.

1. Transmit/Receive Operational Example

Figure 2:
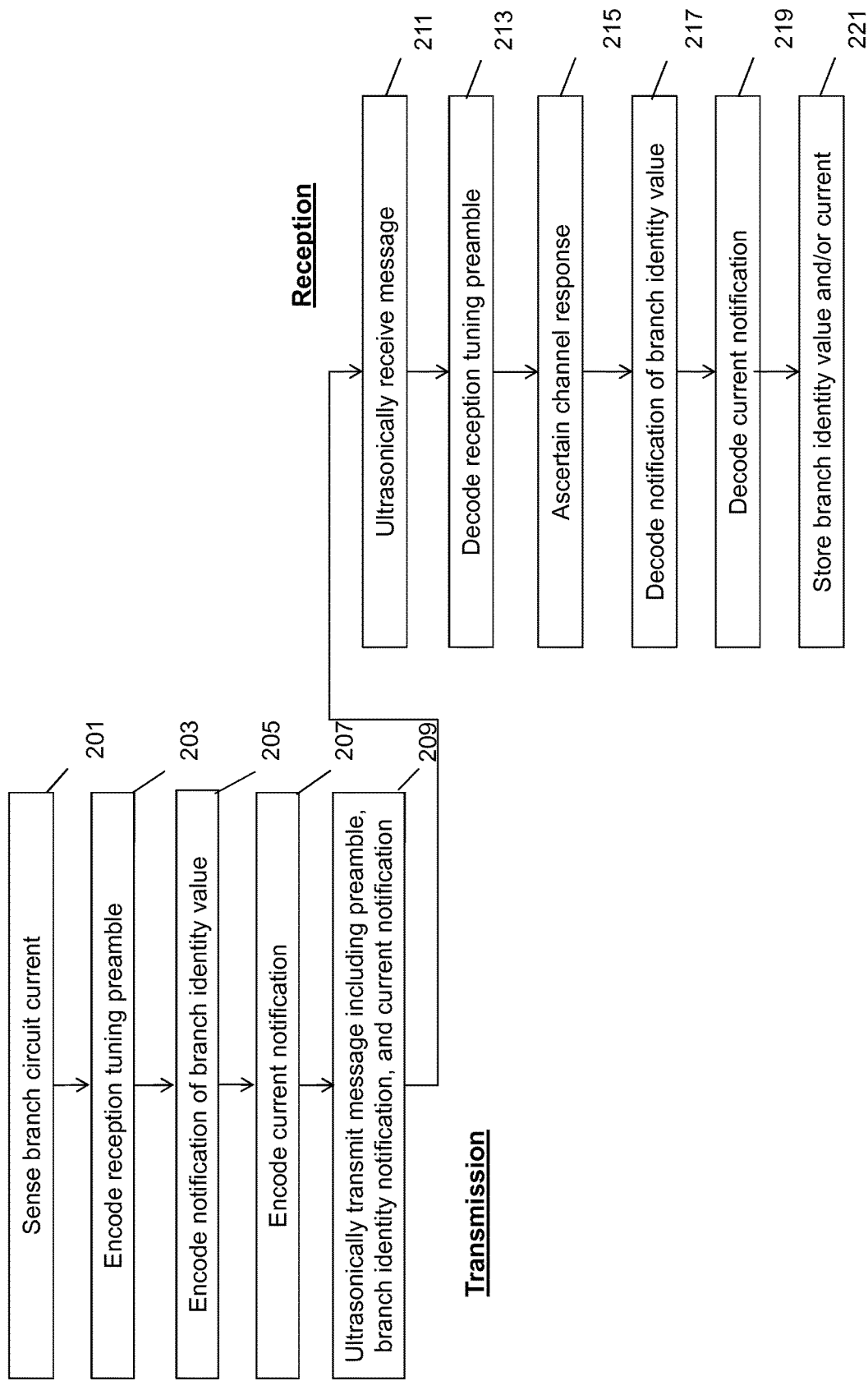
FIG. 2 illustrates an example of operations performed by the branch circuit current monitor and the data aggregator, such as in the load center of FIG. 1.

FIG. 2 illustrates an example embodiment of the invention, showing operations performed by branch circuit current monitor 105 and by data aggregator 103. Branch circuit current monitor 105 senses the current of a branch circuit (operation 201). The branch circuit current monitor may report each sensed current of the branch circuit, only certain sensed currents, a peak current since last report, and/or an average current (e.g., RMS) since last report. In preparing a report, branch circuit current monitor 105 encodes a reception tuning preamble (operation 203), encodes a notification of the identity of the branch (e.g., the branch number) (operation 205), and encodes a notification of the current which is to be reported (e.g., a given sensed current, the peak current since last report, or the average current since last report). The Branch circuit current monitor 105 ultrasonically transmits via ultrasonic transmitter 117 an ultrasonic pulse message which includes as a burst the reception tuning preamble, includes as a burst the branch identity notification, and includes as a burst the current notification (operation 209).

The reception tuning preamble is made up of a fixed quantity of pulses which is indicative of a reception tuning preamble, the branch identity notification is made up of a quantity of pulses proportional to the branch identity, and the current notification is made up of a quantity of pulses proportional to the current which is to be reported. The formulation of the message is such that the branch identity notification and current notification are transmitted after the reception tuning preamble. Branch circuit current monitor 105 may send the message multiple times. How often the message is sent may depend upon the magnitude of the current to be reported. In other words, the repeated sending may be performed with a frequency proportional to the current which is to be reported. For instance, a report of a higher current may be sent more often than a report of a lower current.

A no-transmission (quiet) time may follow the preamble, branch identity notification, and/or current notification. The no-transmission time may be of a duration which takes into account a channel response (e.g., reverberation time) of ultrasonic transmissions within load center 101. Load center 101 may be considered the medium and/or channel for these ultrasonic transmissions.

With further regard to FIG. 2, data aggregator 103 receives via its ultrasonic detector 107 the ultrasonic pulse message sent by branch circuit current monitor 105 (operation 211). Data aggregator 103 decodes from the message the reception tuning preamble (operation 213). The fixed quantity of pulses which indicates a reception tuning preamble is known by data aggregator 103. In decoding the reception tuning preamble data aggregator 103 determines the quantity of pulses included in a received ultrasonic burst, compares that determined quantity to a known, fixed quantity which indicates the reception tuning preamble, and considers the burst to provide a reception tuning preamble when the determined quantity matches the known quantity. Data aggregator 103 may employ the reception tuning preamble in ascertaining the channel response (e.g., reverberation time) of ultrasonic transmissions within load center 101 (operation 215) as further discussed below.

Data aggregator 103 decodes from the message the notification of the branch identity value (operation 217). In decoding the branch identity value data aggregator 103 determines the quantity of pulses included in the ultrasonic burst providing the branch identity value and employs the proportionality between the determined quantity and the branch identity, as discussed below. In operation 219, data aggregator 103 decodes from the message the current notification. In decoding the current notification, the data aggregator 103 determines the quantity of pulses included in the ultrasonic burst providing the current notification and employs the proportionality between the determined quantity and the current. Where data aggregator 103 ascertains the channel response, in decoding the branch identity value and/or the current notification, data aggregator 103 may perform compensation, as discussed below, employing that channel response.

According to at least one embodiment, significant reverberation might be expected within the load center from the vantage point of the relationship between the wave lengths of the ultrasonic transmissions and the size of the load center. Illustratively, taking the speed of sound in the load center to be approximately 1100 feet per second (FPS) and the ultrasonic transmission frequency to be 20 kHz, would show the wavelength of these transmissions to be approximately ⅝ of an inch, bearing in mind the relation speed=frequency·wavelength. Then, considering that ⅝ of an inch wavelength in view of a typical load center size would lead to the expectation of significant reverberation.

In operation 221, data aggregator 103 stores the branch identity and/or the current in memory 111. For example, the information of the current can include current consumption data, such as provided in the current notification (e.g., a given sensed current, the peak current since last report, or the average current since last report). Where a no-transmission time follows the preamble, branch identity notification, and/or current notification, data aggregator 103 may interpret data received during such a no-transmission time as one or more collisions.

2. Pulse Message Format Example

Figure 3:
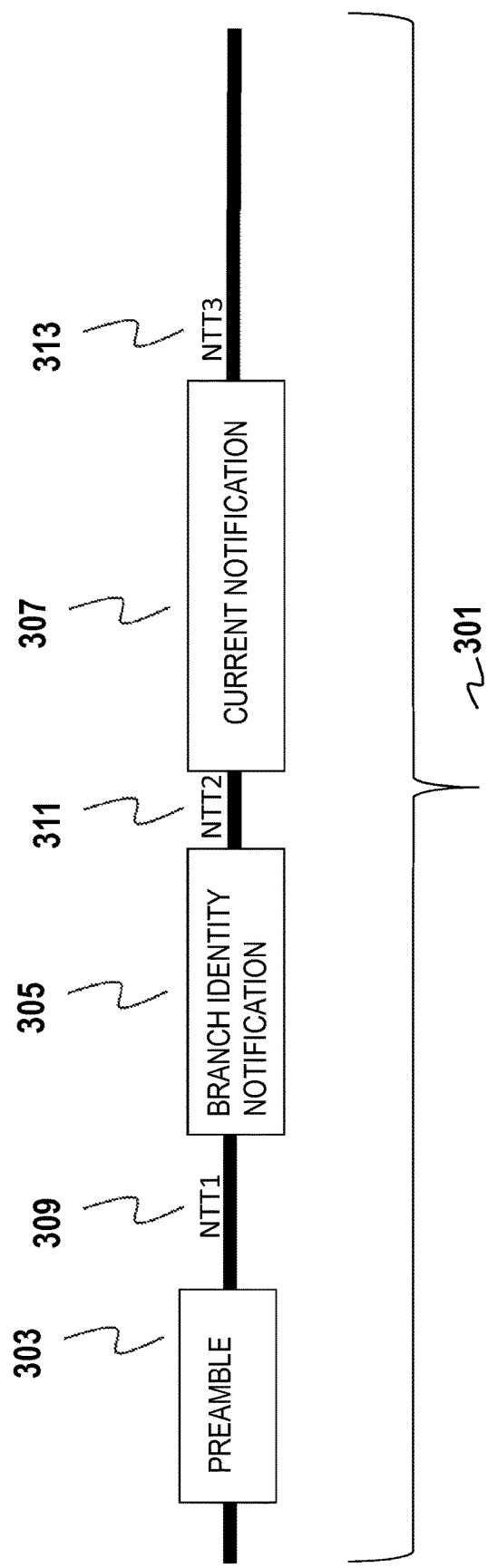
FIG. 3 illustrates an example of an ultrasonic pulse message, which includes a reception tuning preamble burst, a branch identity notification burst, a current notification burst, a first no-transmission time, a second no-transmission time, and a third no-transmission time, in accordance with an embodiment of the present disclosure.

FIG. 3 illustrates an example embodiment of the invention, showing ultrasonic pulse message 301 having reception tuning preamble burst 303, branch identity notification burst 305, current notification burst 307, first no-transmission time 309, second no-transmission time 311, and third no-transmission time 313. Such no-transmission times may alternately or additionally be referred to as quiet times. The bursts may be made up of ultrasonic waves (e.g., sine waves, square waves, and/or other waveforms). Each cycle of such a wave is referred to herein as a pulse.

Preamble burst 303 is made up of a fixed number of pulses which the data aggregator will expect. Because the first burst of the message will be the preamble and because the data aggregator knows how many pulses to expect, the data aggregator can ascertain from the preamble the channel response within the load center. The data aggregator can then employ that ascertained channel response to properly receive branch identity notification burst 305 and current notification burst 307.

No-transmission times 309, 311, 313 are channel idle states. If data is received by the data aggregator during a no-transmission time (e.g., during third no-transmission time 313, the data aggregator considers one or more collisions to have occurred and discards data. For example, the data aggregator may discard both the portion of message 301 received thus far and the incoming data causing the collision.

Branch identity notification burst 305 is a variable length burst. The quantity of pulses which make up the burst is proportional to the branch identity (e.g., branch number). Each x of these pulses may indicate a y increment in branch identity. As an illustrative example, x may be 5 and y may be 1 such that 15 pulses indicates a branch number of 3. The selection of x may be such that x is an odd number. Implementation may be such that branch identity can be properly ascertained by the data aggregator even when the data aggregator fails to receive pulses of branch identity notification burst 305. For instance, rounding may be performed at the data aggregator. As an illustrative example, suppose that x is 5 and that the branch number to be conveyed by an ultrasonic transmitter is 37. Under this scenario the ultrasonic transmitter transmits branch identity notification burst 305 as a 185-pulse burst. Suppose further that only 183 of these pulses are received by the data aggregator (e.g., due to error and/or transmission losses). Where the data aggregator performs rounding, 183/5=36.6 which rounds up to the proper branch number of 37. As such, the data aggregator determines the proper branch number despite it not having received certain pulses.

As noted branch identity notification burst 305 is a variable length burst. The maximum length of this burst will depend on both the highest value branch identity to be transmitted and the value of x. Illustratively, where the highest branch number to be indicated is 42 and x is 5 the maximum length of identity notification burst 305 is 210 pulses.

Current notification burst 307 is also a variable length burst. The quantity of pulses which make up the burst is proportional to the current which is to be reported. Each x of these pulses may indicate y units of current (e.g., y amps). As an illustrative example, each pulse may indicate 0.1 A of current.

The data aggregator, when receiving ultrasonic pulse message 301, counts the quantity of pulses in each of the bursts provided by that message. The employment of pulse counting may be viewed as beneficial. For instance, pulse counting alternatives such as the employment of characters and/or binary encoding might be viewed as necessitating so much error correction that the increased transmit time, power consumption, and/or cost called for to do that error correction would show pulse counting to be a more attractive choice than those alternatives.

As an illustrative example, the waves which make up the bursts may be 20 kHz waves, and as such the bursts may be made up of pulses which are each 50 μs long. The cyclic frequency of the waves which make up the bursts—2 kHz in the above example—may correspond to hardware of the branch circuit current monitor and/or of the data aggregator (e.g., to the internal system clock of a microcontroller thereof.). The pulse duration may be subject to a certain variance (e.g., +/−2%, leading to a +/−1 μs variance in the case of the example of 50 μs pulses).

As a further illustrative example, reception tuning preamble burst 303 may be 5 ms long, branch identity notification burst 305 may have a maximum length of 11 ms, current notification burst 307 may have a maximum length of 75 ms, and no-transmission times 309, 311 may each be 5 ms long, thus leading to a maximum total packet time of 110 ms. Returning to the above example where each pulse of current notification burst 307 indicates 0.1 A, notification burst 307 would have a minimum length of 0.1 ms.

The medium for the ultrasonic transmissions—i.e., the load center—may be viewed as a difficult to control channel due to circuit breakers, cables, interior, air, and other load center aspects. As such, in at least one example embodiment many ensembles of the data provided by the ultrasonic pulse messages discussed herein are collected over time to assess energy consumption. Moreover, according to at least one example embodiment the average quality of such data may need to meet certain requirements (e.g., 2% average accuracy over numerous transmission) but any particular transmission may tolerate a somewhat looser specification (e.g., 5% average accuracy over numerous transmission).

The branch circuit current may send a given message 301 multiple times. How often the message is sent may depend upon the magnitude of the current to be reported. Implementation may be such that a message which serves to report a higher current is sent more often than a message which serves to report a lower current. The current resolution for this current magnitude may be set low enough to facilitate being able to properly determine even for low currents how often the message is to be sent.

As one example, the branch circuit current monitor may employ an equation which takes the current to be reported as an input and which outputs a frequency value indicating how often, the message is to be sent. The equation might be a non-linear function and/or a square law equation. Optionally, a random number generator might be employed to dither the times about the above calculated nominal. In at least one embodiment the branch circuit current monitor alternately or additionally employs a technique other than the use of an equation to determine, in view of the current to be reported, how often the message is to be sent. For instance, the branch circuit current monitor may employ a lookup table. The time resolution of such message transmissions may, as a non-limiting example, be set to two-times the total packet time.

For instance, the correlation between the current to be reported and how frequently to send the corresponding message may be such that, illustratively, 0.1 A currents are reported every 60 s, 10 A currents are reported every 5.1 s, 10.1 A currents are reported every 5 s, and 75 A currents are reported every 1.0 s. The corresponding time resolution is 0.1 s. Where implementation is such that 75 A is the maximum current to be reported, 1.0 s represents the highest possible current transmission frequency. In other words, no current will be reported more often than every 1.0 s. Said differently, 75 A will be the current which will enjoy the minimum time between reports.

3. Pulse Message Collision Diagram Example

Figure 4:
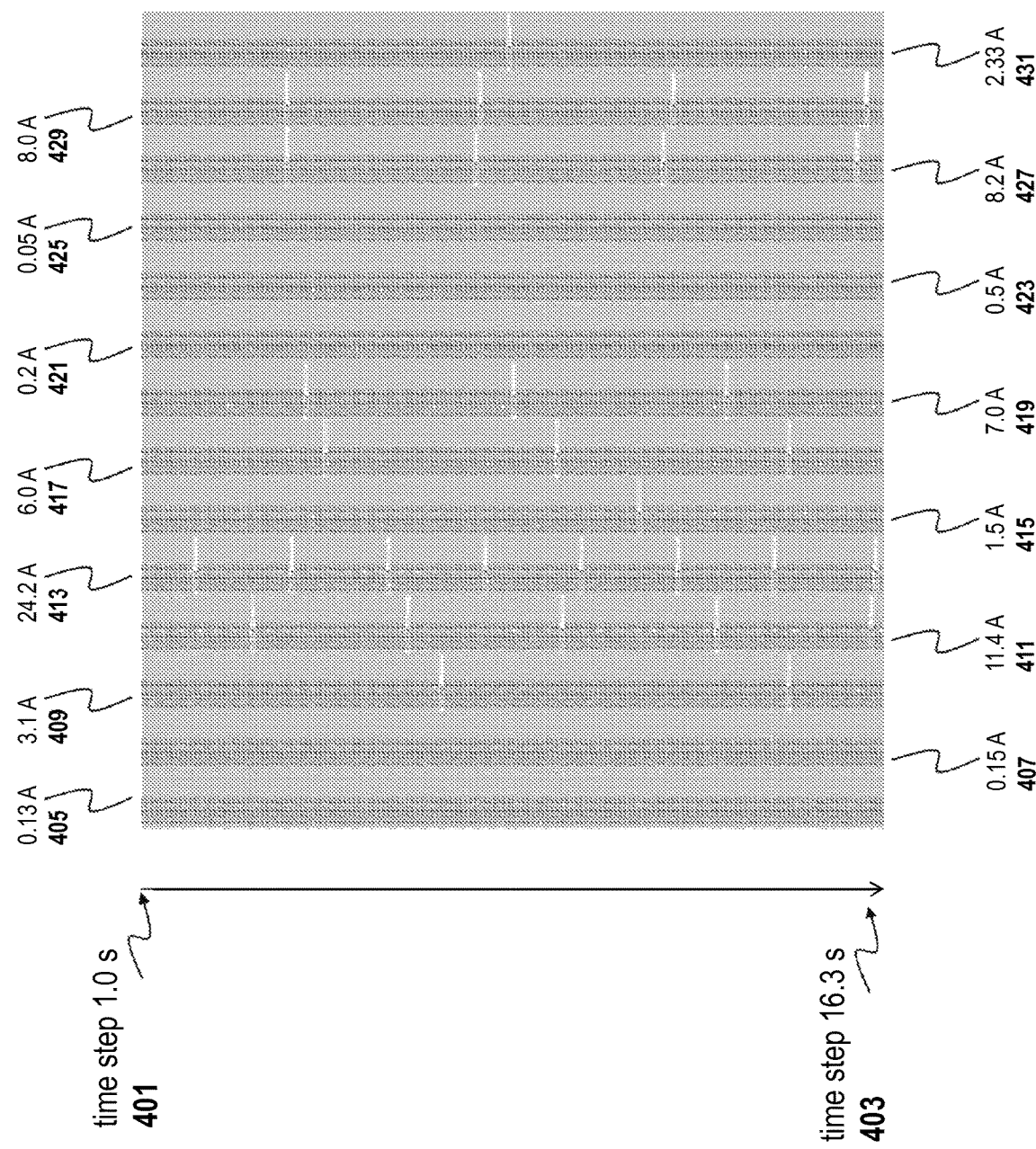
FIG. 4 illustrates an example of a pulse message collision diagram.

FIG. 4 illustrates an example embodiment of the invention, showing a pulse message collision diagram. Along the y-axis of the collision diagram time runs from 1.0 s (401) to 16.3 s (403). The x-axis includes the currents 0.13 A (405), 0.15 A (407), 3.1 A (409), 11.4 A (411), 24.2 A (413), 1.5 A (415), 6.0 A (417), 7.0 A (419), 0.2 A (421), 0.5 A (423), 0.05 A (425), 8.2 A (427), 8.0 A (429), and 2.33 A (431). The highlighted boxes show times at which current report transmissions occur for particular currents. As such, a row containing two or more highlighted boxes is indicative of a collision between the two or more current transmissions to which those boxes correspond. It can therefore be seen that current transmissions which suffer collisions at certain points in time escape collision at other times. In this way, it is clear that after a couple of minutes current transmissions get through. Achieving such getting through call for fine enough current resolution and/or fine enough time resolution.

4. No-Transmission (Quiet) Time Duration Example

Figure 5:
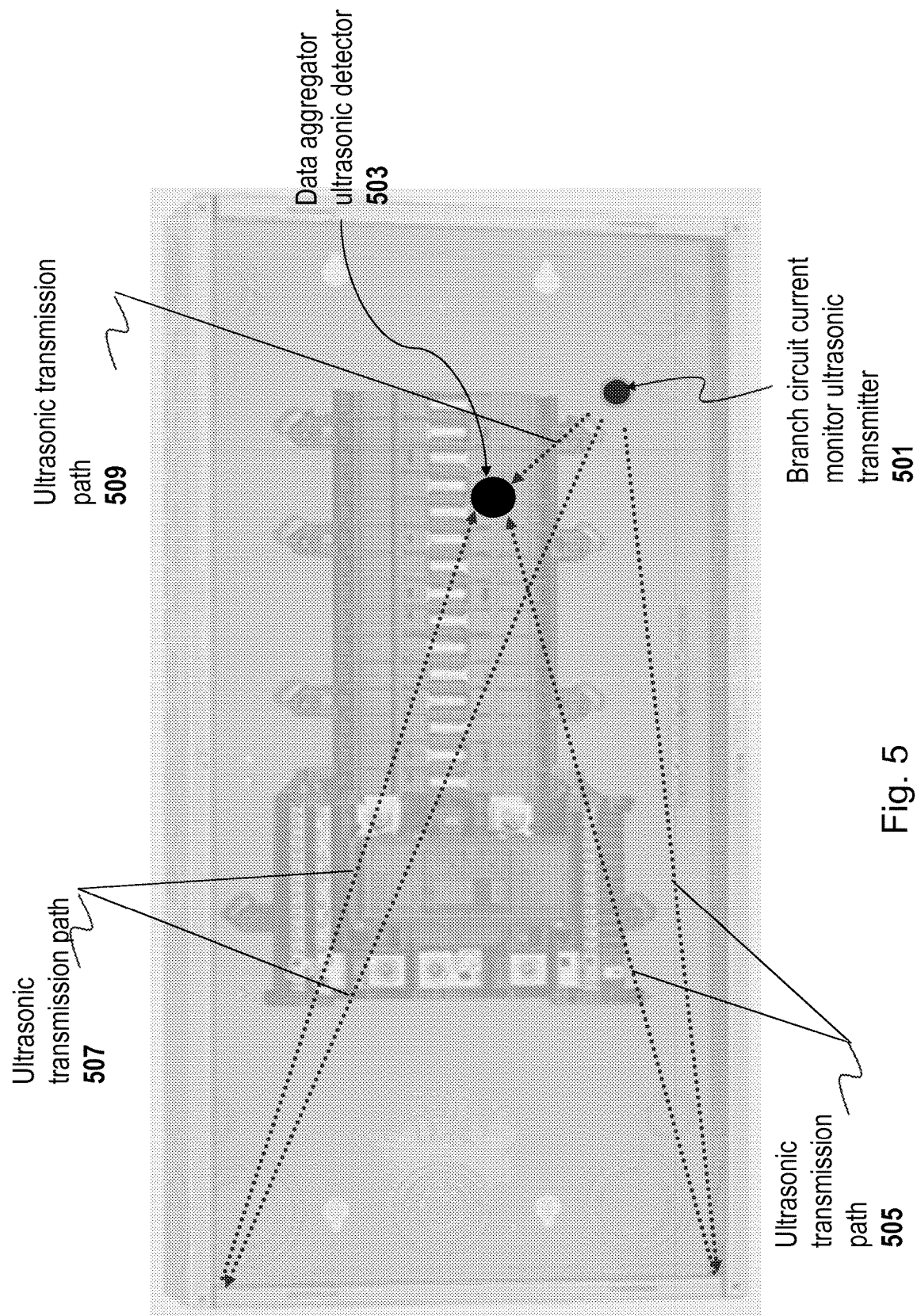
FIG. 5 illustrates an example of ultrasonic transmission paths between an ultrasonic transmitter of a branch circuit current monitor and an ultrasonic detector of a data aggregator within an enclosure of a load center, such as in FIG. 1.

An illustrative determination of no-transmission time duration will now be discussed in connection with FIG. 5. FIG. 5 illustrates an example embodiment of the invention, ultrasonic transmission paths 505, 507, 509 between branch circuit current monitor ultrasonic transmitter 501 and data aggregator ultrasonic detector 503 within an enclosure of a load center. Ultrasonic transmission path 507 represents the maximum path length for an ultrasonic transmission within the load center. According to at least one embodiment, it may that the no-transmit time duration may not be long enough to allow for a true settling-out of the channel response of the load center. As such, the chosen no-transmission time duration may be a best-possible no-transmission time duration.

As an illustrative example of no-transmission time duration determination, suppose the load center of FIG. 5 to be a 40 position load center, and further suppose that the ultrasonic transmission path corresponding to the maximum path length within the load center—i.e., path 507—has a length of 54". Taking the speed of sound within the load center to be approximately 1100 FPS, the time for an ultrasonic transmission to get from ultrasonic transmitter 501 to ultrasonic detector 503 via path 507 is approximately 5 ms. This may appear as a constructive interference.

Additionally suppose the particular channel response which is to be considered to be the reverberation time. Next consider reverberation time equation:

$$T(-60 \text{ dB}) = 0.016 \cdot \frac{V}{(\alpha \cdot S)}$$

where T indicates the time required for the ultrasonic transmission to decay by 60 dB once the transmission has stopped, 0.016 is the appropriate factor k for the load center, V is the volume of the load center, $\alpha$ is the load center absorption coefficient, and S is the absorbing surface area of the load center.

Then consider 10% voltage time exponential decay equation:

10% voltage time=(signal level$_{initial}$)$^2 \cdot e^{-13.82} \cdot t/T$ where 10% voltage time is the 10% voltage time corresponding to the preamble burst energy, signal level$_{initial}$ is the initial signal level corresponding to the preamble burst energy, e is the base of the natural logarithm, −13.82 is the appropriate rate of decay for the load center, t is 0.10 as per the voltage time to be calculated to be the 10% voltage time, and T is the above-noted reverberation time.

Continuing with the illustrative example, take V to be 0.03 m², S to be 0.9 m², $\alpha$ to be 0.01 for the scenario of the load center interior having a painted steel interior devoid of added insulation, $\alpha$ to be 0.1 for the scenario of having an interior to which foam insulation has been added, and signal level$_{initial}$ to be 4 A.

Given these values, for the scenario of the load center interior having a painted steel interior devoid of added insulation the reverberation time calculates to approximately 56 ms and the 10% voltage time calculates to approximately 18 ms. For the scenario of foam insulation having been added, the reverberation time calculates to approximately 5 ms and the 10% voltage time calculates to approximately 1.6 ms.

In view of this, for the no added insulation scenario, implementation may opt to have the tuning preamble burst be 20 ms long, to make the branch identity notification burst have a maximum length of 20 ms, to make the current notification burst have a maximum length of 75 ms, and to have each of the three no-transmission times be 20 ms in length, thus leading to a maximum total packet time of approximately 175 ms.

Further in view of this, for the insulation-added scenario, implementation may opt to have the tuning preamble burst be 2 ms long, to make the branch identity notification burst have a maximum length of 20 ms, to make the current notification burst have a maximum length of 75 ms, and to have each of the three no-transmission times be 2 ms each, thus leading to a maximum total packet time of approximately 105 ms.

As such, implementation may opt to have the tuning preamble burst be shorter than that of the example of FIG. 3, make the no-transmission times each be 20 ms in length to cover all load center circumstances including empty load centers, and/or pad pulses in the data to ensure energy fill.

With regard to the employ of the reception tuning preamble in ascertaining the channel response (e.g., reverberation time) of ultrasonic transmissions within the load center and/or performing compensation employing that channel response, the response of the channel to the branch identity notification burst and/or the current notification burst may be taken to be the same as the response of the channel to the reception tuning preamble burst. Such may be taken to hold for branch identity and/or current notification bursts having energies less than or equal to the energy of the reception tuning preamble. Alternately or additionally, such may be taken to hold where either or both of those two bursts have energies greater than the energy of the preamble. In at least one embodiment, it may be taken to be the case that the energy put into the channel by the preamble burst begins to dissipate at the end of the last pulse of that burst, and/or the total energy input into the channel by the preamble burst may be taken as not important so long as the channel is totally energized to a steady state condition. Moreover, in at least one embodiment pulse padding may be applied to the branch identity notification burst and/or to the current notification burst so that the response of the channel to these bursts will be the same as the response of the channel to the preamble burst. For instance, such padding might be performed in the case of low current branch identity notification bursts and/or the current notification bursts.

5. Transmitted/Received Pulse Message Bursts Example

Figure 6:
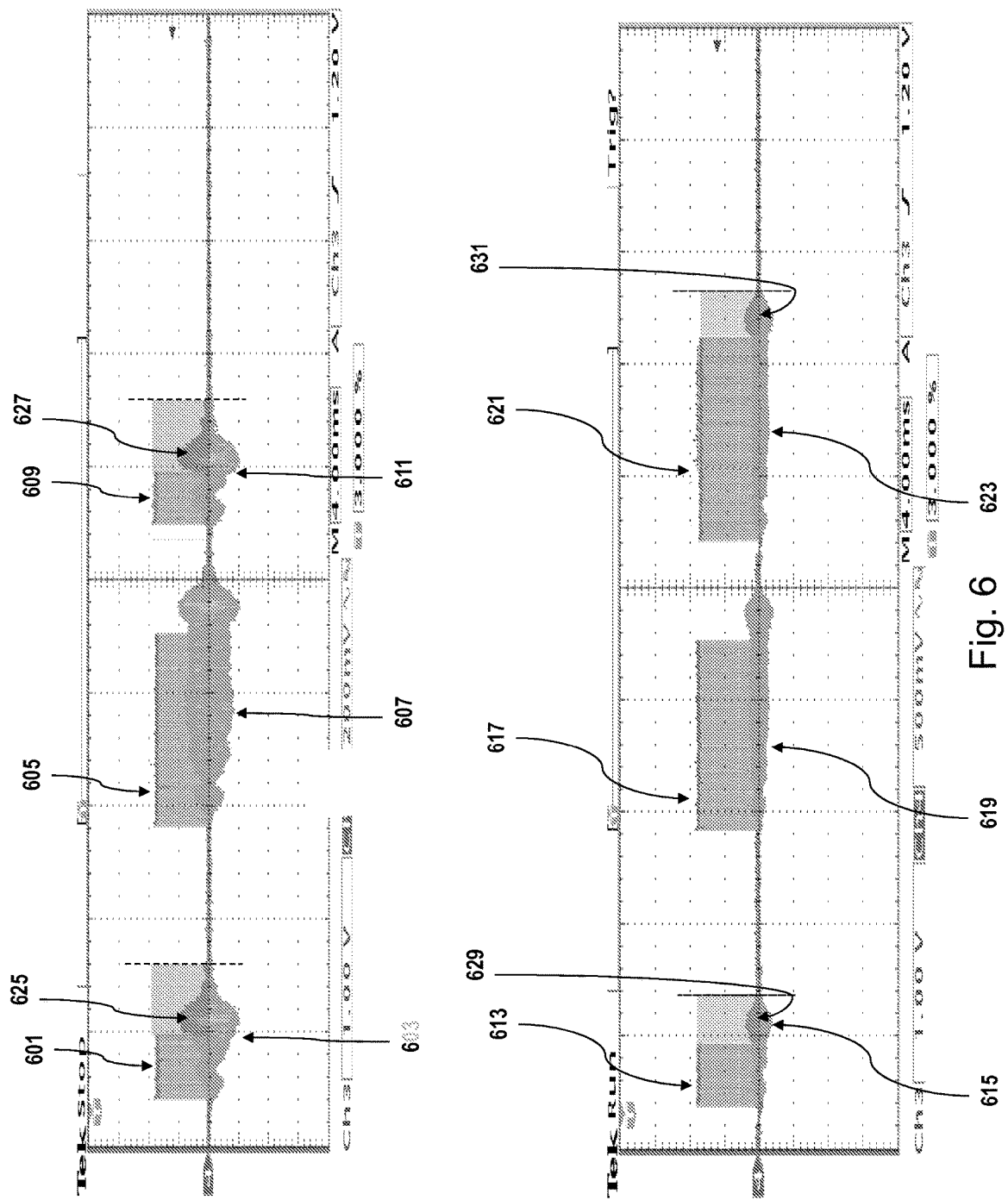
FIG. 6 illustrates an example of ultrasonic pulse message bursts as sent by the branch circuit current monitor and as seen by the data aggregator.

FIG. 6 illustrates an example embodiment of the invention, showing ultrasonic pulse message bursts as sent by the branch circuit current monitor (e.g., corresponding to the current monitor's drive of the ultrasonic transmitter) and as seen by the data aggregator. Shown in FIG. 6 are, for the scenario of the branch identity and current notification bursts having energies equal to that of the reception tuning preamble, the reception tuning preamble burst as sent by the branch circuit current monitor 601, that burst as seen at the data aggregator 603, the branch identity burst as sent by the branch circuit current monitor 605, that burst as seen at the data aggregator 607, the current notification burst as sent by the branch circuit current monitor 609, and that burst as seen at the data aggregator 611. Also shown in FIG. 6 are, for the scenario of the branch identity and current notification bursts having energies greater than that of the reception tuning preamble, the reception tuning preamble burst as sent by the branch circuit current monitor 613, that burst as seen at the data aggregator 615, the branch identity burst as sent by the branch circuit current monitor 617, that burst as seen at the data aggregator 619, the current notification burst as sent by the branch circuit current monitor 621, and that burst as seen at the data aggregator 623. Waveform nulls appearing in bursts as seen at the data aggregator might, according to at least one embodiment, occur more often in emptier load centers and/or occur less often in fuller load centers. Moreover, these nulls might be viewed as arising due to destructive wave front combinations at the position of the ultrasonic detector of the data aggregator. The FIG. 6 scenario of the branch identity and current notification bursts having energies equal to the reception tuning preamble corresponds to 4 A current. The FIG. 6 scenario of the branch identity and current notification bursts having energies greater than the reception tuning preamble corresponds to a 16 A current, and therefore four times the energy as the previous scenario.

As an illustrative example of ascertaining the channel response and performing compensation employing that channel response, the data aggregator may, knowing the quantity of pulses in the preamble, recognize those seen pulses which are channel response artifacts (e.g., reverberation artifacts) rather than true preamble pulses. The data aggregator may then subtract from the quantity of pulses seen in connection with the branch identity and/or current notification bursts that quantity of pulses. For instance, where a pulses are recognized to be channel response artifacts rather than true preamble pulses and c pulses are seen in connection with current notification burst, the data aggregator may consider the current notification pulse quantity to be c−a.

Shown in FIG. 6 are, for the scenario of the branch identity and current notification bursts having energies equal to the reception tuning preamble, artifact pulses 625 and to-be-subtracted pulses 617. Likewise, shown in FIG. 6 for the scenario of the branch identity and current notification bursts having energies greater than the reception tuning preamble are artifact pulses 629 and to-be-subtracted pulses 631.

Zooming in on the example bursts of FIG. 6 as seen by the data aggregator would show the rise time and delay of branch identity burst 607 and of current notification burst 611 to be similar to the rise time and delay of reception tuning preamble burst 603. Likewise, zooming in on the example bursts as seen by the data aggregator would show the rise time and delay of branch identity burst 619 and of current notification burst 623 to be similar to the rise time and delay of reception tuning preamble burst 615.

Considering bursts as sent by the branch circuit current monitor and as seen by the data aggregator, bursts having greater numbers of pulses (e.g., bursts indicating higher branch numbers and bursts indicating higher currents) will be of longer time duration and appear wider when viewed in the vein of FIG. 6. Likewise bursts having fewer pulses (e.g., bursts indicating lower branch numbers and bursts indicating lower currents) will be of shorter time duration and appear narrower. Moreover, according to at least one example embodiment viewing, in the vein of FIG. 6, bursts as sent by the branch circuit current monitor and then zooming in on those bursts would show the bursts to be made up of waveforms having a particular fundamental frequency—for instance 19.5 kHz—corresponding to the current monitor's drive of the ultrasonic transmitter. Viewing, in the vein of FIG. 6, bursts as seen by the data aggregator would, according to at least one example embodiment, show the bursts to be made up of sinusoidal waveforms. Such phenomenon might be viewed as being due to the interplay between the bandwidth (BW) of the ultrasonic transmitter and a high-Q bandpass filter of the data aggregator.

According to at least one example embodiment, viewing in the vein of FIG. 6 bursts (e.g., the preamble burst) as sent by the branch circuit current monitor and as seen by the data aggregator would show a time shift between those bursts as sent and as seen. Such phenomenon might be viewed as being due to the speed of sound. Illustratively, taking the speed of sound in the load center to be approximately 1100 FPS and taking the branch circuit current monitor and the data aggregator to be situated approximately 7 inches apart yields a delay of approximately 530 µs (i.e., 11 pulses at 20 kHz). Also, according to at least one example embodiment viewing in the vein of FIG. 6 bursts as seen by the data aggregator and zooming in on those bursts would show the amplitude of the waveforms to have an attack. Such phenomenon might be viewed as being due to a filter of the data aggregator having a delayed response by virtue of storing energy which needs to be changed as the input changes. Illustratively, taking the settling time of the filter to be:

$$-\frac{\ln(\text{tolerance\_fraction})}{\text{damping\_ratio} \cdot \text{natural\_frequency}}$$

where tolerance_fraction is set to 0.20 to reflect waiting to reach 20% of the final value, damping_ratio is set to reflect 3 dB, and natural_frequency is set to approximately 1 kHz, the filter settling time is approximately 1.6 ms.

6. Branch Circuit Monitor Circuit Example

Figure 7:
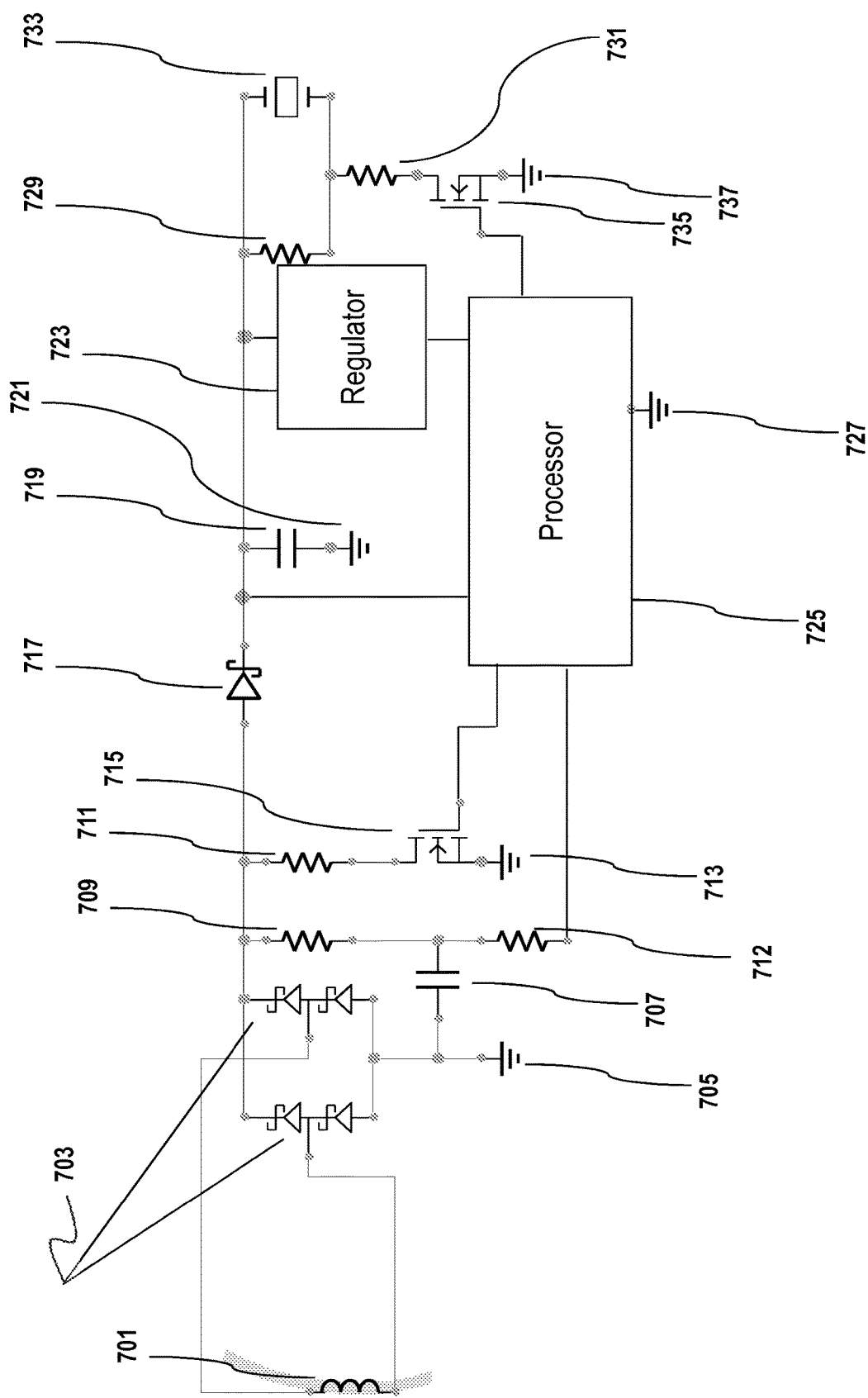
FIG. 7 illustrates a diagram of components of an example of a branch circuit current monitor, in accordance with an embodiment of the present disclosure.

FIG. 7 illustrates an example embodiment of the invention, showing a circuit diagram of a branch circuit current monitor. Shown in FIG. 7 are current transformer (CT) 701, diode bridge rectifier 703, ground 705, filter capacitor 707, filter resistor 709, burden resistor 711, resistor 712, ground 713, current control transistor 715, diode 717, charging capacitor 719, ground 721, regulator 723, processor 725, ground 727, resistor 729, resistor 731, ultrasonic transmitter 733, ultrasonic transmitter drive transistor 735, and ground 737. The conductor of the branch circuit wire threaded through CT 701 may be referred to as a "primary" of the CT, and the coil of CT 701 may be referred to as a "secondary" CT relative to that "primary" CT.

As non-limiting examples, CT 701 may be 950 turns (T), or 1500 T, employ a #35 wire size and/or be rated for 30 A, 50 A, 75 A, 100 A, 125 A, or 225 A. As further non-limiting examples, the diodes may be plain silicon diodes rather than Schottky diodes, burden resistor 711 may be 49.9 ohms, capacitor 719 may be regulated to 220 µF, resistor 729 may be a 1 k resistor, resistor 731 may be a 1 k resistor, ultrasonic transmitter 733 may be a piezo resonator, and regulator 723 may be a low drop out (LDO) regulator (e.g., a LP2950 LDO regulator). The piezo resonator might, for instance, be a PS1240P02CT3, be a 4 kHz piezo resonator, and/or be a 4 kHz piezo resonator pushed to 20 kHz. As a further non-limiting example, processor 725 may be an extreme low power (XLP) microcontroller. As additional non-limiting examples, processor 725 may be an eight-pin microcontroller or a 40-pin microcontroller (e.g., a PIC18F45K20 microcontroller).

As additional non-limiting examples, the branch circuit current monitor might be implemented so as to generate sufficient voltage (e.g., approximately 4 volts) at the minimum reporting current to power the circuit, so as to be size-compatible with load center spacing requirements, so as to supply sufficient current at the minimum branch current for which a current is induced in the coil of the CT (i.e., at the minimum pri current) to power the circuit, and/or in a manner employing a housing core which envelopes the coil and a printed circuit board (PCB) which fits over the end of that coil. For instance, a circular PCB (e.g., being 1.2 inches in diameter) with a hole (e.g., having a ⅜ of an inch diameter) in the middle might be employed. A housing core having a height of approximately 0.15 inches, having a width of approximately 0.315 inches, and/or being formed of a material having a particular, chosen relative permeability (e.g., 12000 µ,) might, for example, be used.

Charging capacitor 719 is charged via induced current which is received from CT 701 and rectified to direct current (DC) via rectifier 703. Regulator 723 senses the charge state of charging capacitor 719. Once regulator 723 has sensed that charging capacitor 719 has reached a desired, predetermined charge value, regulator 723 commences providing to processor 725 power provided by capacitor 719. Processor 725 then employs current control transistor 715 to discontinue the charging of charging capacitor 719. After this, processor 725, in accordance with that which is discussed above, formulates ultrasonic pulse messages regarding the current detected at CT 701 and transmits these messages via ultrasonic transmitter 733 using ultrasonic transmitter drive transistor 735. The components of FIG. 7 not specifically discussed (e.g., filter capacitor 707) provide the clear support roles called for to support the operation of those components of FIG. 7 which have been specifically discussed.

7. Data Aggregator Example

Figure 8:
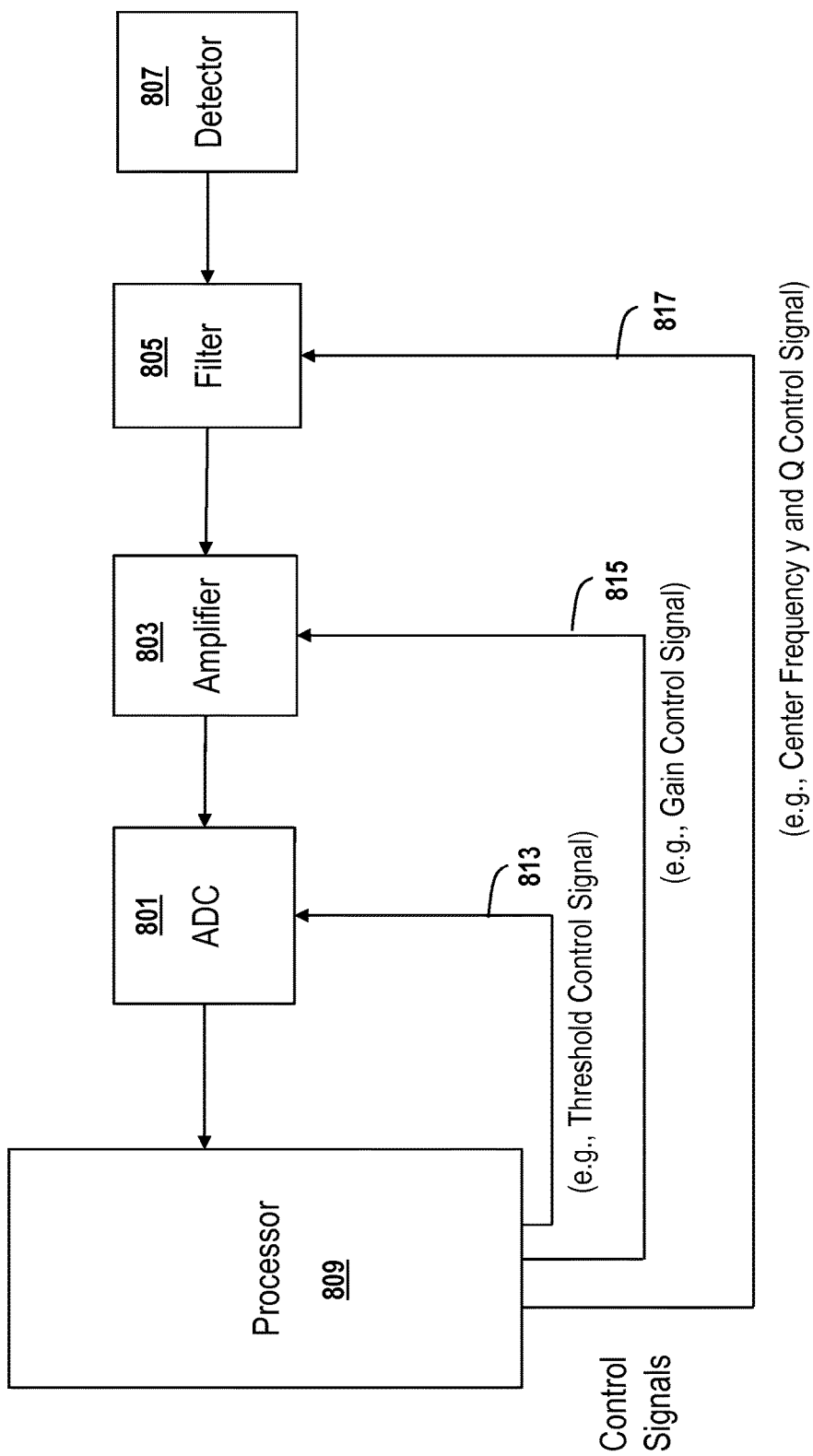
FIG. 8 illustrates a diagram of components of an example of a data aggregator circuit diagram, in accordance with an embodiment of the present disclosure.

FIG. 8 illustrates an example embodiment of the invention, showing a circuit diagram of a data aggregator. Shown in FIG. 8 are an analog-to-digital converter (ADC) 801, dynamically-controlled high gain amplifier 803 (e.g., 30× gain), dynamically-controlled high-Q bandpass (i.e., narrow pass band) filter 805 (e.g., operating at 22 kHz), ultrasonic detector 807, and mid-performance microcontroller processor 809. A Schmitt trigger device can also be used instead of the ADC 801. As non-limiting examples, ultrasonic detector 807 may be, an ultrasonic microphone and/or a microphone array, mid-performance microcontroller processor 809 may have functions including analyzing the signal path during the preamble and adjusting the receive hardware for proper performance, and detector 807 may possess bandwidth (BW) capability into the low ultrasonic range. Such a microphone might, for instance, be a CMB6544 or a CUI-5247TF from CUI, Inc.

In accordance with that which is discussed above, the ultrasonic pulse messages transmitted by the branch circuit current monitor are received by detector 807 and processed by components 801-803 so as to yield a digital pulse stream output to processor 809. The processor 809 may provide threshold control signals to ADC 801 (as shown by reference numeral 813). In at least one embodiment internal threshold control occurs internally at processor 809 instead of or in addition to processor 809 providing those signals. The processor 809 may also provide gain control signals to amplifier 803 (as shown by reference numeral 815), and provide frequency and Q-factor control signals to filter 805 (as shown by reference numeral 817). Processor 809 performs operations in accordance with that which is discussed above (e.g., decoding the message, counting pulses in order to determine the identity of the branch to which the message pertains and the current reported by the message, and storing to memory). The data aggregator circuit of FIG. 8 might be implemented using OP183 operational amplifiers (OP-AMPs) from Analog Devices.

In an alternate embodiment, processor 809 is instead a high-performance microcontroller, a switched capacitor or analog/digital hybrid amplifier/filter is employed in place of amplifier 803 and filter 805. The processor 809 may provide control parameters to the switched capacitor or analog/digital hybrid amplifier/filter.

In a further alternative embodiment, processor 809 is once again instead a high-performance microcontroller and a programmable gain amplifier (PGA) and a phase-locked loop device with clock divider (e.g., a 4046 series phase-locked loop device) are employed in place of components 801-805, the placement of the phase-locked loop device and the PGA being such that signal flow is from detector 807 to the PGA, from the PGA to the phase-locked loop device, and from the phase-locked loop device to the high-performance microcontroller. Moreover, a loop locked feedback is provided from the phase-locked loop device to the high-performance microcontroller. The high-performance microcontroller may provide divisor parameters to the phase-locked loop device, and may provide control parameters to the PGA.

In an additional alternative embodiment, processor 809 is a very high performance microcontroller or a digital signal processor (DSP) and components 801-805 are replaced with a single amplifier. The placement of this single amplifier is such that signal flow is from detector 807 to the single amplifier, and from the single amplifier to the very high performance microcontroller or DSP. Moreover, the very high performance microcontroller or DSP may provide control parameters to the single amplifier. Additionally, high performance microcontroller processor 809 may have functions including performing channel optimization using digital correlation (e.g., $\sin^2 + \cos^2 \cdot adc\_input\_data$) and/or Kalman filters).

As a non-limiting example regarding the operation of the high performance microcontroller processor 809, assuming that a resolution of 32 signal levels is desired the microcontroller might be configured to sample data at a 32×20 kHz or 32×640 kHz, with the microcontroller perhaps being a PIC24 from Microchip Technology. After sampling, the microcontroller might multiply each data point by sin and cos functions—i.e., the noted $\sin^2 + \cos^2 \cdot adc\_input\_data$ might be performed—and sum the multiplication results looking for high correlation with the employed frequency (e.g., with 20 kHz). These operations might, optionally, be performed on a multi-cycle basis (e.g., in order to save memory) and/or in real time or near-real time. As an illustrative estimate, two multiplies and an add along with data management might be performed within 1/640 kHz (i.e., on order of 1.5 µs). Implementation might, for instance, have the high-performance microcontroller be a microcontroller with a 16 MHz cycle time (Tcyc) and on order of 8 kilobytes or more of random access memory (RAM).

According to various embodiments, additional approaches for dealing with channel response issues might alternately or additionally be employed. For instance, telephony echo cancellation techniques might be employed.

According to an example embodiment of the invention, installation firstly involves removal of a load center deadfront. Next, the data aggregator is attached to the load center. The data aggregator might, for instance, be placed into one or more circuit breaker slots of the load center, interface with a bus plug of the load center, and/or be placed onto the door of the load center. The bus plug might, be a building management system (BMS) bus plug, and/or might include circuit breaker control (e.g., QO PL circuit breaker control). Placing the data aggregator onto the door might, according to at least one example embodiment result in multipath effects which are evidenced by signal smearing, with the placement of insulation mitigating these multipath effects. Moreover, placing the data aggregator onto the door might be in connection with a built-into-the-door (BID) configuration. According to at least one embodiment attachment of the data aggregator involves wiring a pigtail of the aggregator to the neutral bar of the load center. Moreover, according to at least one embodiment the data aggregator may include a status light emitting diode (LED), a memory card slot (e.g., a micro SD card slot), and/or a memory read/write LED.

Next, at least one branch circuit current monitor is programmed to correspond to a particular branch circuit of the load center. Up to 42 branch circuits might, for instance, be supported. As one example, the programming is performed using a tool which couples inductively with circuitry of the branch circuit current monitor. As another example, coupling is via electrical connector. The tool might be handheld. A sticker or other label indicating the branch circuit to which the branch circuit current monitor has been programmed to correspond might optionally be placed onto the current monitor. After this, their corresponding load wires are threaded through the one or more programmed branch circuit current monitors. According to at least one embodiment this involves detachment of a corresponding load wire from the load center (e.g., from a corresponding circuit breaker thereof) prior to threading and reattachment of the wire afterwards. After this the deadfront is replaced, thus completing installation. Installation may optionally be restricted to qualified persons. A power supply may power the data aggregator. This power supply might, for instance, be a low-voltage power supply, derive its power using the neutral of the load center along with hot L1 and/or hot L2 of the load center, be plugged into a number of load center bus positions (e.g., two bus positions), be installed onto the door of the load center (e.g., with the power supply receiving power via pogo pins which run through the load center deadfront), and/or be controlled by an opened-closed state of a door of the load center. The door installation might be in connection with a Board in Door (BID) configuration. Optionally the data aggregator can be implemented so as to all or a subset of building management system (BMS) functionality.

Use according to at least one example embodiment involves removing a micro SD card or other memory from the data aggregator and inserting it into a memory reader of a PC, smartphone, or other device. Software for accessing the memory might, for example, be launched on the PC or other device. As another example, the memory may be accessible via built-in facilities of the operating system of the PC or other device (e.g., via Windows File Explorer, OS X Finder, and/or GNOME Nautilus). The PC or other device may perform one or more of formatting the memory, setting the time, setting the date, and setting the location. After this, the memory is removed from the memory reader of the PC or other device and reinserted into the data aggregator.

With the memory reinserted, the data aggregator acts in accordance with that which is discussed above to receive current reports from one or more branch circuit current monitors and write corresponding branch identity and current usage information to the memory. The memory can be left in for a desired period of time (e.g., a number of hours, days, months, or years). During that time the writing to memory will occur. When desired, the memory can be removed from the data aggregator and inserted into the memory reader of the PC or other device. The PC or other device then accesses the branch identity and current usage information. The PC or other device might, for example, employ installed software which provides its user with a presentation regarding the branch identity and current usage information (e.g., energy consumption charts and graphs), which allows for sharing of current usage information (e.g., with other users), and/or which supplies data allowing the user to compare his current usage information with the current usage information of other users (e.g., the user might receive neighborhood current usage information and/or data correlating the current usage information of others with weather patterns). The user might, as another example, directly access the data using the built-in operating system facilities. Finally, the memory may be removed from the memory reader and reinserted into the data aggregator for continued writing of branch identity and current usage information.

The placement of various description set forth herein in either or both of the Summary section and the Detailed Description of the Example Embodiments section is to facilitate ease of discussion, and such placement choice is non-limiting.

The processor(s) of the branch circuit current monitor and the data aggregator may interact with internal or external memory, which may store computer executable programs or codes and data. The processor(s) may execute computer executable program or code and process data to implement the various functions described herein. Furthermore, the pulse encoding and decoding and other functions described herein can be performed by any suitable processing system, including a processor(s), controller(s), ASIC, FPGA and dedicated hardware.

Moreover, although specific example embodiments of the invention have been disclosed, persons of skill in the art will appreciate that changes may be made to the details described for the specific example embodiments, without departing from the spirit and the scope of the invention.

The invention claimed is:

1. A load center for a power distribution system comprising:
 a branch circuit current monitor of the load center, the branch circuit current monitor including:
  a current sensor coil for sensing a current on a branch circuit, and
  an ultrasonic transmitter for ultrasonically transmitting an ultrasonic pulse message using ultrasonic pulses, the ultrasonic pulse message corresponding to the current; and
 a data aggregator of the load center, the data aggregator including an ultrasonic detector for receiving the ultrasonic pulse message transmitted by the ultrasonic transmitter.

2. The load center of claim 1, wherein the ultrasonic pulse message comprises a reception tuning preamble, a branch identity notification, and a current notification corresponding to the current.

3. The load center of claim 2, wherein the branch circuit current monitor further includes a first processing system configured to:
 encode the reception tuning preamble, wherein the preamble comprises a fixed quantity of pulses;
 encode the branch identity notification of the branch identity value, wherein the branch identity notification comprises a first quantity of pulses, and wherein the first quantity is proportional to the branch identity value; and
 encode the current notification corresponding to the current, wherein the current notification comprises a second quantity of pulses, and wherein the second quantity is proportional to the current,
 wherein the branch identity notification and the current notification are transmitted after the transmission of the preamble.

4. The load center of claim 2, wherein a no-transmission time follows one or more of the reception tuning preamble transmission, the branch identity notification transmission, and the current notification transmission, and wherein the no-transmission time is of a duration which takes into account ultrasonic transmission reverberation.

5. The load center of claim 2, wherein the data aggregator further comprises a second processing system configured to:
 decode from the message the reception tuning preamble, wherein a determined quantity of pulses is compared to a known fixed reception tuning preamble pulse quantity and the reception tuning preamble is recognized;
 decode from the message the branch identity notification of the branch identity value, wherein a first quantity of pulses is determined, wherein the first quantity of pulses is interpreted as proportional to the branch identity value; and
 decode from the message the current notification corresponding to the current, wherein a second quantity of pulses is determined, wherein the second quantity of pulses is interpreted as proportional to the current,
 wherein the branch identity notification and the current notification are received after receipt of the preamble.

6. The load center of claim 5, wherein the second processing system of the data aggregator is further configured to ascertain a channel response corresponding to the reception tuning preamble,
 wherein the second processing system decodes the branch identity notification of the branch identity value by performing compensation employing the ascertained channel response, and
 wherein the second processing system decodes the current notification by performing compensation employing the ascertained channel response.

7. The load center of claim 2, wherein a no-transmission time follows one or more of the preamble, the branch identity notification, and the current notification, and wherein data received during one or more of the no-transmission times is interpreted as one or more collisions.

8. The load center of claim 7, wherein the channel response comprises a channel reverberation time.

9. The load center of claim 2, wherein the data aggregator further comprises a memory for storing the branch identity value and current consumption data according to the current notification, the memory being a nonvolatile memory.

10. The load center of claim 1, wherein the message is transmitted in accordance with a transmission frequency proportional to the sensed current such that a report of a higher current is sent more often than a report of a lower current.

11. The load center of claim 1, wherein the branch circuit current monitor is programmed to correspond to a particular branch circuit to be monitored, wherein a load wire of the branch circuit is located within the load center, and wherein the load wire threads through the branch circuit current monitor.

12. The load center of claim 1, wherein the data aggregator is at least one of:
 located within at least one circuit breaker slot of the load center; or
 attached to a door of the load center.

13. The load center of claim 1, further comprising a power supply, wherein the data aggregator is powered by the power supply, and wherein activation of the power supply is controlled by an opened-closed state of a door of the load center.

14. A load center for a power distribution system comprising:
 an enclosure of the load center,
 a branch circuit current monitor within the enclosure including:
  a current sensor coil for sensing a current on a branch circuit, and
  an ultrasonic transmitter for ultrasonically transmitting an ultrasonic pulse message using ultrasonic pulses, the ultrasonic pulse message comprising a reception tuning preamble, a branch identity notification, and a current notification corresponding to the current; and
 a data aggregator within the enclosure including:
  an ultrasonic detector for receiving the ultrasonic pulse message transmitted by the ultrasonic transmitter,
  a memory for storing the branch identity value and current consumption data according to the current notification, and a processing system configured to:
  decode from the message the reception tuning preamble, wherein a determined quantity of pulses is compared to a known fixed reception tuning preamble pulse quantity and the reception tuning preamble is recognized,
  decode from the message the branch identity notification of the branch identity value, wherein a first quantity of pulses is determined, wherein the first quantity of pulses is interpreted as proportional to the branch identity value, and
  decode from the message the current notification corresponding to the current, wherein a second quantity of pulses is determined, wherein the second quantity of pulses is interpreted as proportional to the current,
wherein the branch identity notification and the current notification are received after receipt of the preamble.

15. The load center of claim 14, wherein the memory is a nonvolatile memory.

16. The load center of claim 15, wherein the memory is removable from the aggregator.

17. The load center of claim 14, wherein the branch circuit current monitor is self-powered from its current sensor coil.

18. A method of providing information sensed at a branch circuit current monitor to a data aggregator within a load center for a power distribution system, the branch circuit current monitor including a current sensor coil, a first processing system and an ultrasonic transmitter, the data aggregator including an ultrasonic detector, a second processing system and a memory, the method comprising:
  sensing, via the current sensor coil, a current on a branch circuit; and
  encoding, via the first processing system, a reception tuning preamble, wherein the preamble comprises a fixed quantity of pulses;
  encoding, via the first processing system, a branch identity notification of the branch identity value, wherein the branch identity notification comprises a first quantity of pulses, and wherein the first quantity is proportional to the branch identity value;
  encoding, via the first processing system, a current notification corresponding to the current, wherein the current notification comprises a second quantity of pulses, and wherein the second quantity is proportional to the current;
  ultrasonically transmitting, via the ultrasonic transmitter, an ultrasonic pulse message using ultrasonic pulses, the ultrasonic pulse message comprising the reception tuning preamble, the branch identity notification, and the current notification,
wherein the branch identity notification and the current notification are transmitted after the transmission of the reception tuning preamble.

19. The method of claim 18, further comprising:
  receiving, via the ultrasonic detector, the ultrasonic pulse message transmitted by the ultrasonic transmitter;
  decoding, via the second processing system, the reception tuning preamble from the message, wherein a determined quantity of pulses is compared to a known fixed reception tuning preamble pulse quantity and the reception tuning preamble is recognized;
  decoding, via the second processing system, the branch identity notification of the branch identity value from the message, wherein a first quantity of pulses is determined, wherein the first quantity of pulses is interpreted as proportional to the branch identity value;
  decoding, via the second processing system, the current notification from the message, wherein a second quantity of pulses is determined, wherein the second quantity of pulses is interpreted as proportional to the current;
  storing, in the memory, the branch identity value and current consumption information according to the current notification,
wherein the branch identity notification and the current notification are received after receipt of the reception tuning preamble.

20. The load center of claim 1, wherein the branch circuit current monitor comprises a plurality of the branch circuit current monitors, each of the branch circuit current monitors sensing a current on a different branch circuit via a respective current sensor coil and transmitting an ultrasonic pulse message of sensed current using ultrasonic pulses via a respective ultrasonic transmitter, the data aggregator receiving the ultrasonic pulse messages transmitted by the plurality of the branch circuit current monitors.

* * * * *